United States Patent [19]

Hiruta

[11] Patent Number: 5,463,245
[45] Date of Patent: Oct. 31, 1995

[54] SEMICONDUCTOR INTEGRATED CIRCUIT DEVICE HAVING SEALING MEANS

[75] Inventor: Yoichi Hiruta, Kashiwa, Japan

[73] Assignee: Kabushiki Kaisha Toshiba, Kawasaki, Japan

[21] Appl. No.: 151,176

[22] Filed: Nov. 12, 1993

[30] Foreign Application Priority Data

Nov. 14, 1992 [JP] Japan .................................. 4-328892

[51] Int. Cl.$^6$ ............................................. H01L 23/544
[52] U.S. Cl. ...................... 257/620; 257/626; 257/735; 257/786
[58] Field of Search .................................. 257/620, 723, 257/787, 786, 626, 729, 735

[56] References Cited

U.S. PATENT DOCUMENTS

| | | | |
|---|---|---|---|
| 4,862,322 | 8/1989 | Bickford et al. .......................... | 257/723 |
| 5,136,354 | 8/1992 | Morita et al. ............................. | 257/620 |
| 5,233,130 | 8/1993 | Nishino ..................................... | 257/787 |
| 5,296,745 | 3/1994 | Shirai et al. .............................. | 257/786 |
| 5,317,194 | 5/1994 | Sako .......................................... | 257/796 |

OTHER PUBLICATIONS

"Large-Capacity Memory Mode By Chip Lamination Mounting", Hatada et al., Third Microelectronics Symposium, 86–88 (Jul. 1989).

"A Large Memory Board by Chip Lamination Mounting," of Third Micro-electronics Symposium (MES '89), Jul. 1989, pp. 86–88.

Primary Examiner—Rolf Hille
Assistant Examiner—Roy Potter
Attorney, Agent, or Firm—Finnegan, Henderson, Farabow, Garrett & Dunner

[57] ABSTRACT

A semiconductor integrated circuit device of this invention includes a semiconductor substrate having an active region arranged in a main surface area and an inactive region arranged in a peripheral portion of the main surface area. A semiconductor integrated circuit is formed in the active region in the main surface area of the semiconductor substrate. A connection electrode is formed on the inactive region. One end of a lead is connected to the connection electrode and the other end thereof is arranged to extend to the exterior of the semiconductor substrate. The semiconductor integrated circuit and the connection electrode are electrically connected to each other via an impurity diffusion region. At least the active region of the semiconductor substrate, the connection electrode, part of the lead arranged on the main surface of the semiconductor substrate, and the impurity diffusion region are covered with a sealing body having a sealing substrate.

5 Claims, 9 Drawing Sheets

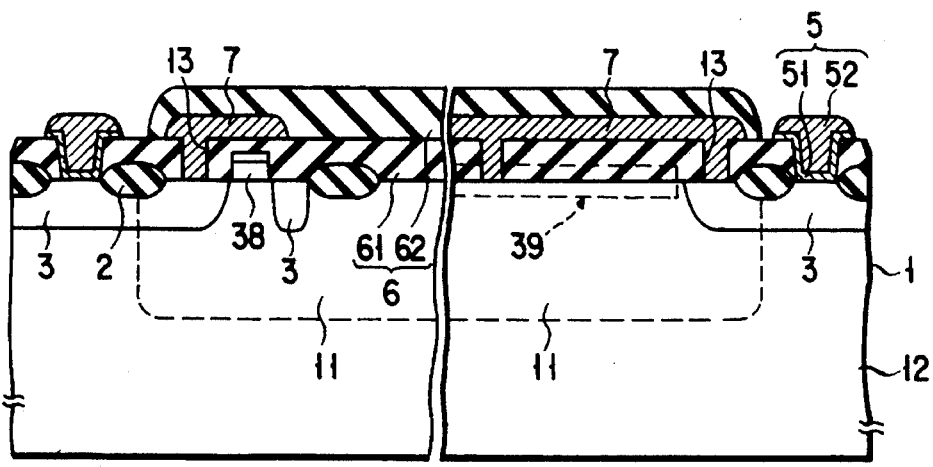
F I G. 4
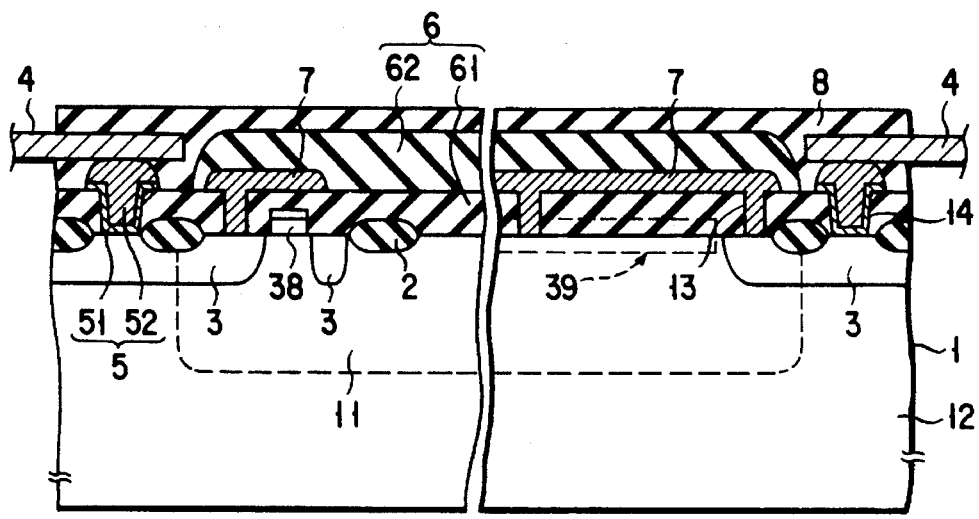
F I G. 5
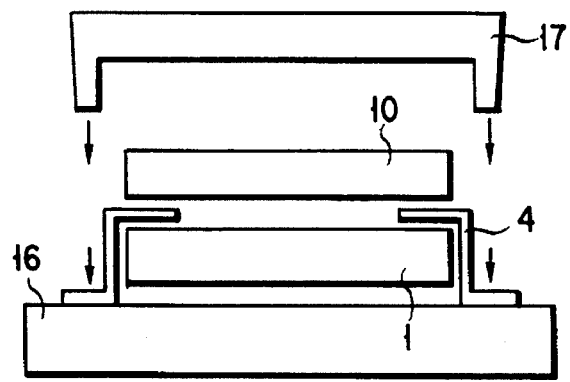
F I G. 6

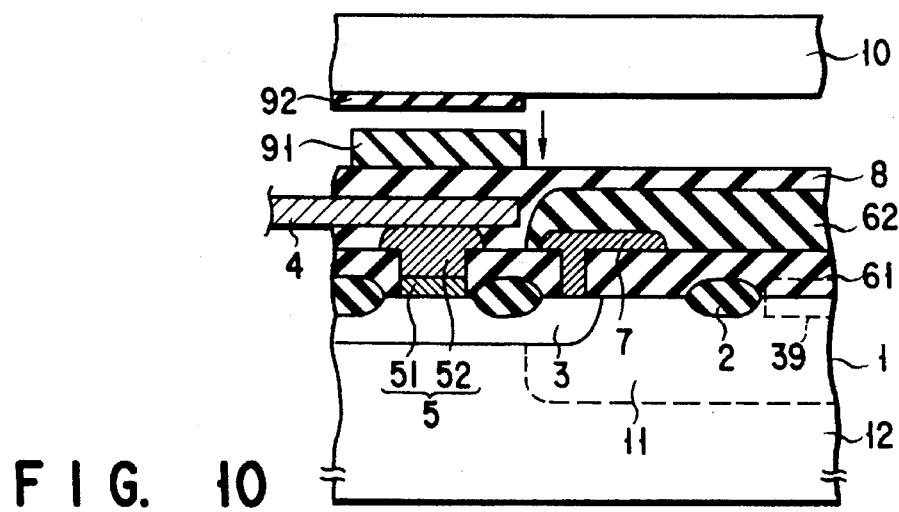
F I G. 10
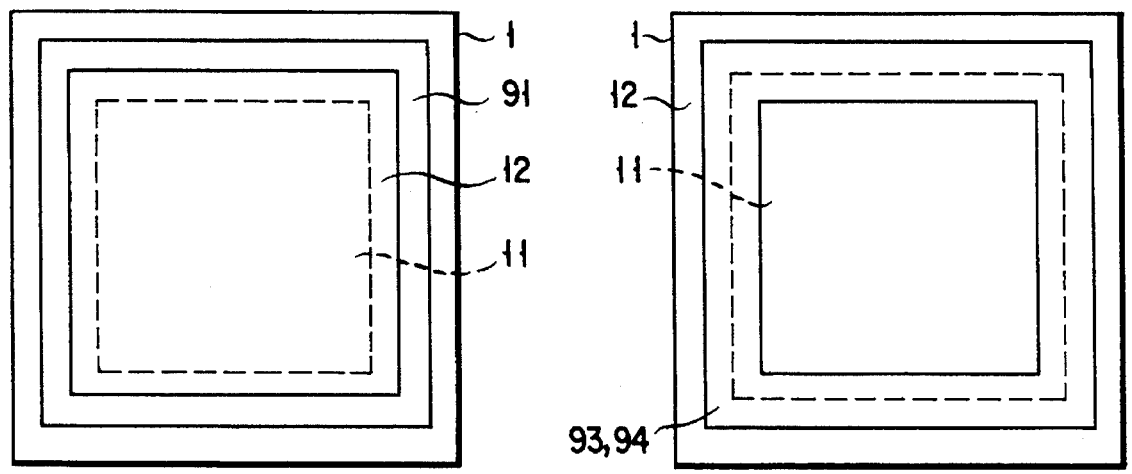
F I G. 11
F I G. 13
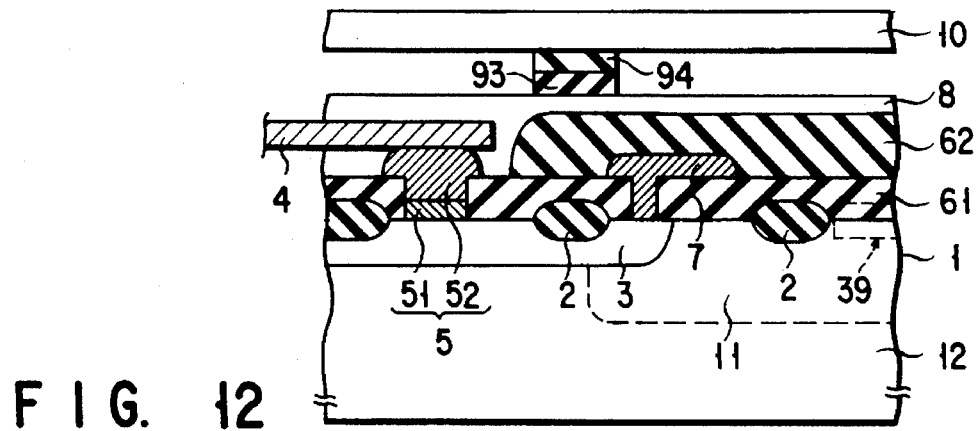
F I G. 12

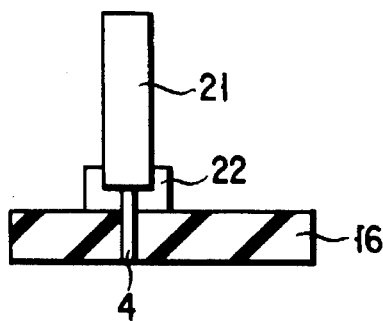
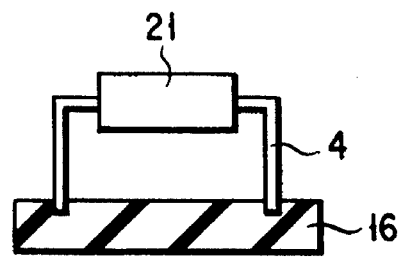
FIG. 16A          FIG. 16B
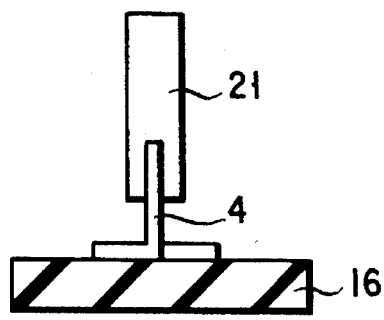
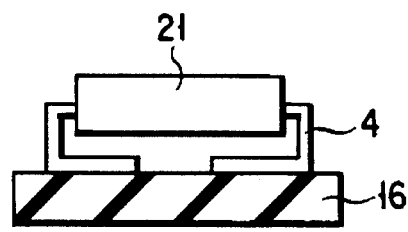
FIG. 16C          FIG. 16D
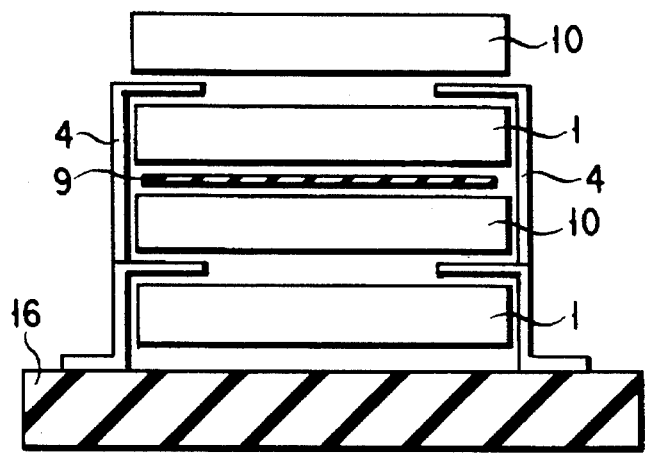
FIG. 17

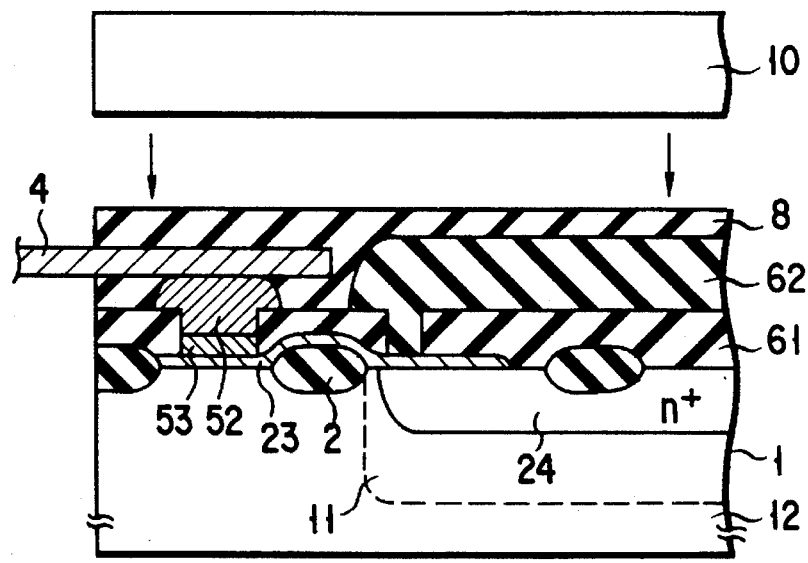
F I G. 25
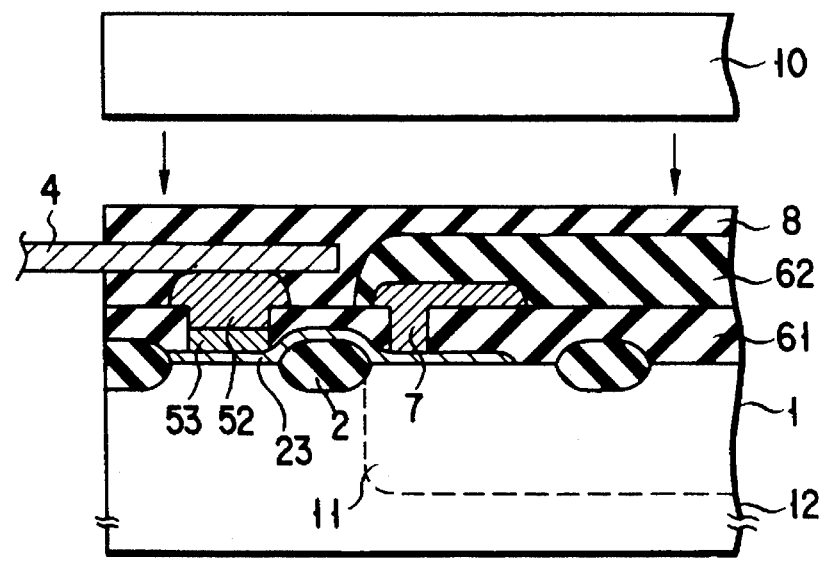
F I G. 26

SEMICONDUCTOR INTEGRATED CIRCUIT DEVICE HAVING SEALING MEANS

BACKGROUND OF THE INVENTION

1. Field of the Invention

This invention relates to a semiconductor integrated circuit device which can be formed with small size and small thickness and formed with high mounting density and which has a package structure which is high in the thermal conductivity and moisture resistance and is highly reliable.

2. Description of the Related Art

A semiconductor integrated circuit device such as an IC and LSI is packaged to protect the semiconductor substrate (chip) on which an integrated circuit is formed from a mechanical damage and a contamination source such as dusts, chemical, gases, and moisture. A package used for packaging the semiconductor integrated circuit device is required to have characteristics such as high hermetic sealing, high heat resistance to high temperatures applied in the assembling process, high mechanical strength, chemically stable characteristic, and good electrical properties such as high insulating property and high frequency characteristic, and resin or ceramics may be used as the material thereof. When resin is used, a DIP (Dual In-line Package) type semiconductor integrated circuit device shown in FIG. 1 may be provided, for example. The semiconductor integrated circuit device is obtained by fixedly attaching a chip 100 having a semiconductor integrated circuit formed thereon to a chip mounting portion 25 of a lead frame, for example, by use of an electrical conductive adhesive agent 35. The chip 100 includes leads 45 for connection with an external circuit, and in general, the lead 45 is formed of a lead frame. A bonding portion 55 is formed on one end of the lead 45 and a connection electrode 65 such as an Al pad formed on the chip 100 is electrically connected to the bonding portion via a bonding wire 75 formed of Al or Au, for example. The chip 100, chip mounting portion 25, bonding wire 75 and part of the lead 45 are covered with mold resin 85 by use of the transfer molding method. As an example of the document disclosing the above technique, there is provided an article "LARGE-CAPACITY MEMORY BOARD BY CHIP LAMINATION MOUNTING" of "THIRD MICROELECTRONICS SYMPOSIUM (MES '89)" July 1989 (TOKIO) in which the technique of protecting the chip surface by use of epoxy-series protection resin is disclosed.

In recent years, the chip size tends to increase with an increase in the integration density of the semiconductor integrated circuit device, and at the same time, the semiconductor integrated circuit device tends to be made smaller and thinner like electronic parts other than the semiconductor integrated circuit device not only in the above-described resin molded type device but also in other type devices, and therefore, the package size must be kept unchanged or reduced to a minimum possible size.

The semiconductor integrated circuit device tends to be made smaller and thinner and it becomes difficult for the conventional package to sufficiently follow the tendency. For example, a memory card has a thickness of 3 mm or more at present, but it must be made further thin and the higher mounting density must be attained. However, as shown in FIG. 1, even if the thickness of the chip 100 itself can be made as small as approx. 0.35 mm, a distance H from the connection portion between the front end of the lead 45 and a circuit board (not shown) on which the semiconductor integrated circuit device is mounted to the top portion of the mold resin 85 covering the chip 100, that is, the height of the semiconductor integrated circuit device will be set to approx. 1.25 mm at a minimum (at this time, the thickness T of the mold resin 85 is approx. 1.0 mm). Further, since the lead 45 is supported by the mold resin 85, it must be covered with the mold resin 85 together with the chip 100 over a certain length. If the sum of the length over which the lead 45 is buried in the mold resin 85 and a distance between the end of the lead 45 and the end of the chip 100 is set to D, the length of one side of the semiconductor integrated circuit device is larger than the length of one side of the chip 100 itself by 2D. When D is set to approx. 1 mm, it becomes longer by approx. 2 mm. Thus, the requirement for reducing the size cannot be satisfied in view of the length.

Further, with the above conventional mold resin type semiconductor integrated circuit device, external water can easily enter the package via a path of the lead 45, bonding wire 75 and connection electrode 65 and from the mold resin having water permeability, thus degrading the long-term reliability. Further, a crack may occur in the mold resin 85 by a temperature rise caused by reflow when the semiconductor integrated circuit device is mounted on a circuit board or the like, thereby causing a serious problem which influences the reliability. In addition, since thermal expansion coefficients of the silicon substrate and the mold resin are different from each other, a crack may occur in the chip at the time of mounting, thereby causing a serious problem. Further, since the thermal conductivity of the mold resin is low, it is difficult to use the mold resin in a semiconductor device whose power consumption is large.

SUMMARY OF THE INVENTION

This invention is made in view of the above-described problems and an object of this invention is to provide a semiconductor integrated circuit device which can be formed with small size and small thickness and formed with high mounting density and which has a package structure which is high in the thermal conductivity and moisture resistance and is highly reliable.

In order to attain the above object, a semiconductor integrated circuit device of this invention comprises a semiconductor substrate including an active region arranged in a main surface area and an inactive region arranged in the peripheral portion of the main surface area; a semiconductor integrated circuit formed in the active region in the main surface area of the semiconductor substrate; a connection electrode formed in the inactive region; lead means having one end connected to the connection electrode and the other end arranged to extend to the exterior of the semiconductor substrate; connection means for electrically connecting the semiconductor integrated circuit to the connection electrode; and sealing means having a sealing substrate for covering at least the active region of the semiconductor substrate, connection electrode, part of the lead means arranged on the main surface of the semiconductor substrate, and connection means.

With the above structure, in this invention, the height and the length of one side of the semiconductor integrated circuit device can be reduced in comparison with the conventional case, and thus it can be made smaller and thinner. Further, since no mold resin is used, external water can be prevented from easily entering the mold package via a path of the lead, bonding wire and connection electrode, thereby enhancing the long-term reliability. In addition, if mold resin is used, it may crack due to the difference between the silicon substrate and the mold resin at the time of a soldering operation for a print circuit substrate. Since the present invention does not use mold resin, the occurrence of such cracks can be prevented. Further, since the mold resin which is low in the thermal conductivity is not used, the thermal conductivity of the device can be improved.

BRIEF DESCRIPTION OF THE DRAWINGS

The accompanying drawings, which are incorporated in and constitute a part f the specification illustrate presently preferred embodiments of the invention, and together with the general description given above and the detailed description of the preferred embodiments given below, serve to explain the principles of the invention.

FIG. 4 is a partial cross sectional view showing one manufacturing step for the semiconductor integrated circuit device following the step of FIG. 3;

FIG. 5 is a partial cross sectional view showing one manufacturing step for the semiconductor integrated circuit device following the step of FIG. 4;

FIG. 6 is a partial cross sectional view showing one manufacturing step for the semiconductor integrated circuit device following the step of FIG. 5;

FIG. 10 is a partial cross sectional view showing one of the manufacturing steps of a third embodiment of a semiconductor integrated circuit device according to this invention;

FIG. 11 is a plan view showing a glass sealing member of FIG. 10;

FIG. 12 is a partial cross sectional view showing one of the manufacturing steps of a fourth embodiment of a semiconductor integrated circuit device according to this invention;

FIG. 13 is a plan view showing a guard band sealing member of FIG. 12;

FIG. 16A to FIG. 16D are views showing respective different mounting means used for mounting chips on circuit boards of semiconductor integrated circuit devices according to this invention;

FIG. 17 is a schematic cross sectional view showing a seventh embodiment of a semiconductor integrated circuit device according to this invention in which a stacked memory is sealed by use of a sealing substrate;

FIG. 25 is a partial cross sectional view showing an embodiment of a semiconductor integrated circuit device according to this invention and using a polysilicon film as connection means for electrically connecting the connection electrode and the semiconductor integrated circuit to each other; and FIG. 26 is a partial cross sectional view showing another embodiment of a semiconductor integrated circuit device according to this invention and using a polysilicon film as connection means for electrically connecting the connection electrode and the semiconductor integrated circuit to each other.

DETAILED DESCRIPTION OF THE PREFERRED EMBODIMENTS

There will now be described an embodiment of a semiconductor integrated circuit device according to this invention with reference to FIG. 2 to FIG. 26.

Figure 2:
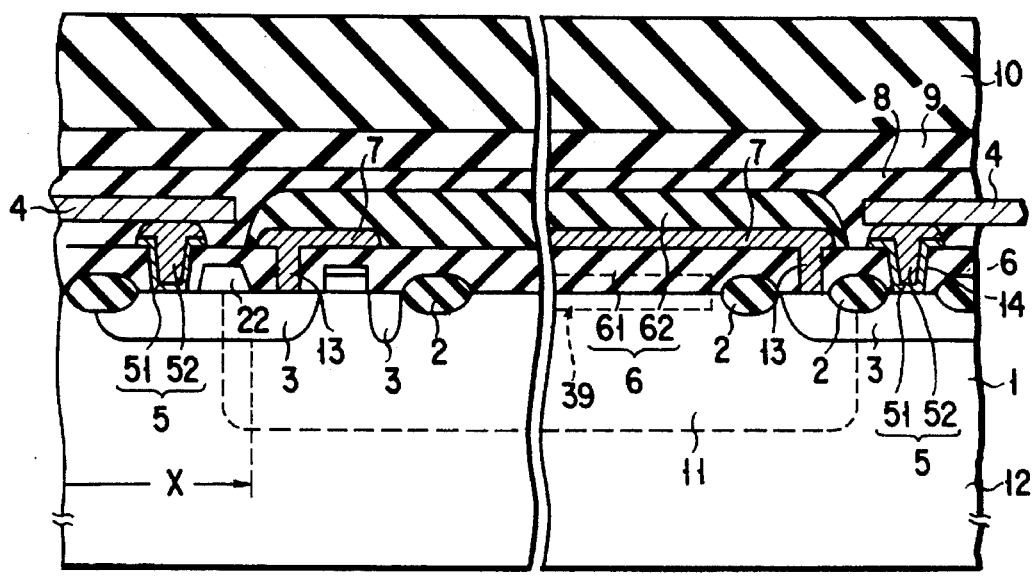
FIG. 2 is a cross sectional view showing the main portion of the structure of a first embodiment of a semiconductor integrated circuit device according to this invention.

FIG. 2 is a partial cross sectional view showing a semiconductor integrated circuit device which is a first embodiment of this invention, and a semiconductor substrate 1 used for forming the semiconductor integrated circuit device is formed of P-type silicon for example. In the semiconductor substrate 1 on which a semiconductor device is formed, an integrated circuit 39 including semiconductor elements is formed in the central portion of the surface area of the main surface thereof and no integrated circuit is formed in the peripheral portion of the main surface. This is because the semiconductor substrate is formed by cutting a circular chip into chips and the cut portion and the peripheral portion thereof are extremely fragile and changed in quality in many cases, and if the peripheral portion is used to form a semiconductor integrated circuit, the characteristic thereof will significantly vary. Therefore, in general, no device is formed in this portion. The central portion of the main surface in which the semiconductor integrated circuit 39 is formed is referred to as an active region 11 and the peripheral portion is referred to as an inactive region 12. A field oxide film 2 or a CVD oxide film 22 are formed at least in the boundary portion between the active region 11 and the inactive region 12 of the surface of the semiconductor substrate 1. For example, an impurity diffusion region 3 of high impurity concentration, which is an opposite conductivity type (e.g., an N type) to that of the substrate, is formed in that portion of the surface area of the semiconductor substrate 1 which lies over the active region 11 and inactive region 12.

The impurity diffusion region 3 is formed to electrically connect the semiconductor integrated circuit 39 formed in the semiconductor substrate 1 to a lead 4 used for connecting the semiconductor integrated circuit 39 to an exterior circuit. In order to connect the lead 4 to the impurity diffusion region 3, a connection electrode 5 is formed on the inactive region 12 in the peripheral portion of the semiconductor substrate 1 which is separated from the active region 11 by means of the oxide film 2 and 22 formed on the semiconductor substrate 1. The connection electrode 5 is formed on the N-type impurity diffusion region 3 which is exposed to the main surface of the semiconductor substrate 1 and is constructed by a barrier metal layer 51 formed of refractory metal such as W in direct contact with the diffusion region and an Au bump electrode 52 formed on the metal layer. The barrier metal layer 51 can be formed of not only refractory metal such as W, Mo, or Ti but also the nitride thereof such as TiN or a silicide such as $Ti_2Si$. For example, the lead 4 formed of Sn-plated Cu is bonded to the bump electrode 52 by thermocompression bonding. The main surface of the semiconductor substrate 1 is covered with an insulation film 61 such as an SiO2 film and the bump electrode 52 projects upwardly to a position above the insulation film 61. The oxide film 22 and the insulation film 61 may be formed at the same time. Further, a metal wiring 7 of Al or the like is formed on the insulating film 61 above the active region 11 of the semiconductor substrate 1. The metal wiring 7 is electrically connected to the semiconductor integrated circuit 39 formed in the active region 11. Then, the metal wiring 7 is electrically connected to the impurity diffusion region 3 via a contact hole 13 formed in the insulating film 61.

As described above, the integrated circuit in the semiconductor substrate 1 is connected to an external circuit via the metal wiring 7 formed on the semiconductor substrate 1, impurity diffusion region 3, connection electrode 5 and lead 4. The metal wiring 7 may be a first-layered wiring formed on the semiconductor substrate 1 or may be a desired one of multi-layered wirings. A passivation film 8 such as a BPSG film is formed on an inter-level insulating film 61 to cover the leads 4 and metal wirings 7 and the passivation film 8 is made flat. A sealing board 10 such as a silicon semiconductor substrate is mounted on the planarized passivation film 8 and the sealing substrate 10 and the passivation film 8 are bonded together by use of organic bonding agent 9 such as epoxy resin or polyimide. Since a distance from the end portion of the semiconductor substrate 1 to the end of the connection electrode 5 is approx. 20 μm, the width of the connection electrode 5 is approx. 50 μm and the width of the field oxide film 2 of the inactive region 12 is approx. 100 μm, then the width x of the inactive region 12 in the peripheral portion of the semiconductor substrate 1 in this embodiment becomes approx. 170 μm. The width x can be set to approx. 60 to 500 μm.

As described above, according to this invention, since a semiconductor device which is made thin and small can be attained and the leads can be formed in the inactive region in the peripheral portion of the semiconductor substrate without using mold resin, the penetration path of external water is not formed in the deep portion of the semiconductor integrated circuit device unlike the conventional case, thereby significantly enhancing the moisture resistance.

Further, the impurity diffusion region 3 for electrically connecting the lead 4 to the active region is connected to a drain or gate 38 of a transistor formed in the active region. Alternatively, the drain of the transistor is formed to extend to the inactive region and part of the drain can be used as connection means for connecting the connection electrode in the inactive region to the transistor in the active region.

Next, a method for manufacturing the semiconductor integrated circuit device of this invention is explained with reference to FIG. 3 to FIG. 6.

Figure 3:
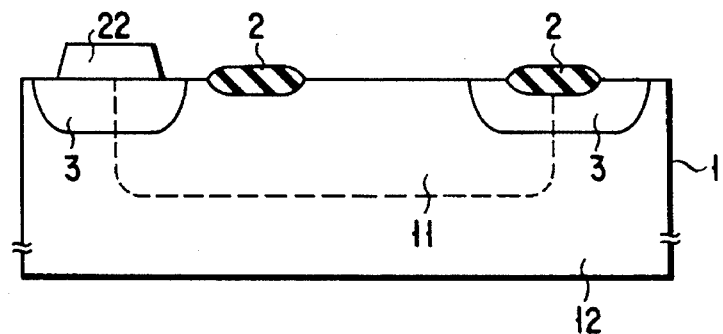
FIG. 3 is a partial cross sectional view showing one of the manufacturing steps for the semiconductor integrated circuit device shown in FIG. 2.

As shown in FIG. 2 and FIG. 3, for example, a P-type silicon semiconductor substrate 1 is used as the substrate, the central portion of the surface area of the main surface face thereof is used as an active region 11, and the peripheral portion thereof and an area other than the surface area are used as an inactive region 12. For example, a field oxide film 2 is formed in at least the boundary portion between the active region 11 and the inactive region 12 formed in the main surface by the LOCOS method and an oxide film 22 is formed by the CVD method. The field oxide film 2 is also formed as an element isolation region in a preset portion of the active region 11. A semiconductor element constructing the integrated circuit 39 is formed on the active region 11 of the semiconductor substrate 12. In this forming step, a desired number of N-type impurity diffusion regions 3 with high impurity concentration are formed over the active region 11 and the inactive region 12 in the surface area of the semiconductor substrate 1 at the same time that a preset impurity diffusion region is formed. Since the impurity diffusion region 3 is used as a low-resistance wiring layer, the conductivity of the impurity is not limited and may be P type or N type. After the semiconductor integrated circuit 39 is formed on the semiconductor substrate 1, an inter-level insulating film 61 such as an $SiO_2$ film is formed on the semiconductor substrate 1.

Next, a plurality of contact holes 13, 14 are formed by selectively etching the inter-level insulating film 61 so as to partly expose the impurity diffusion regions 3 of the active region 11, the impurity diffusion regions 3 of the active region 11 and an area other than the impurity diffusion regions 3 of the active region 11. A barrier metal layer 51 used as a ground metal layer of the connection electrode 5 is formed in the contact hole 14 of the inactive region 12 and a bump electrode 52 of Au or the like is formed on the barrier metal layer 51. For example, A layers are formed in the contact holes 13 of the impurity diffusion region 3 of the active region 11 and selectively connected to A wirings 7 which are formed on the inter-level insulating film 61. Then, an inter-level insulating film 62 is formed on the inter-level insulating film 61 to cover the A wirings 7 formed on the active region 11. The process up to this step is effected for the silicon wafer obtained by slicing a single crystal ingot of silicon. After forming the Al wiring 7 and connection electrode 5, the silicon wafer is divided into a plurality of semiconductor substrates 1 as shown in FIG. 4.

Figure 9:
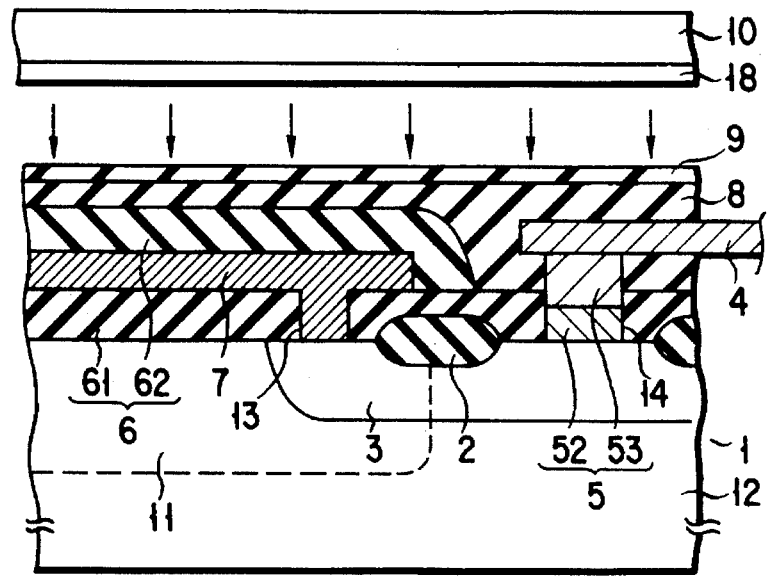
FIG. 9 is a partial cross sectional view showing one manufacturing step for the semiconductor integrated circuit device following the step of FIG. 8.

In this embodiment, the barrier metal layer 51 is also formed on the side wall of the contact hole, but a method for forming the barrier metal layer only on the bottom surface of the contact hole as shown in FIG. 9 as will be described later can be used.

Figure 1:
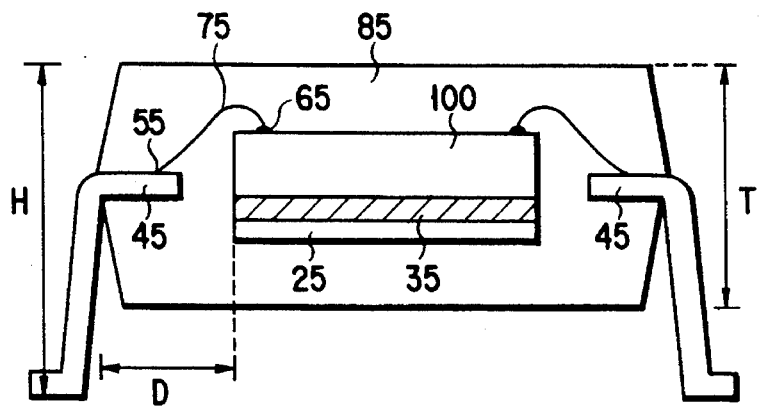
FIG. 1 is a schematic cross sectional view showing the structure of a conventional semiconductor integrated circuit device.

After this, as shown in FIG. 5, one end portion of the lead 4 formed of Cu or the like is mounted on the bump electrode 52 and bonded thereto by thermocompression bonding. Since the surface of the lead 4 is Sn-plated, Sn and Au of the bump electrode 52 create eutectic to fixedly connect the lead 4 and connection electrode 5 together. After a passivation film 8 is formed on the entire surface of the semiconductor substrate 1 including the above connection portions, organic bonding agent 9 such as epoxy resin is coated on the passivation film 8 as shown in FIG. 1 and then a sealing substrate 10 formed of silicon semiconductor having no active region is formed on the bonding agent 9 to bond the semiconductor substrate 1 and the sealing substrate 10 together. As shown in FIG. 6, the front end portion of the lead 4 is mounted on a circuit board 16 by use of a heating tool 17.

Figure 7:
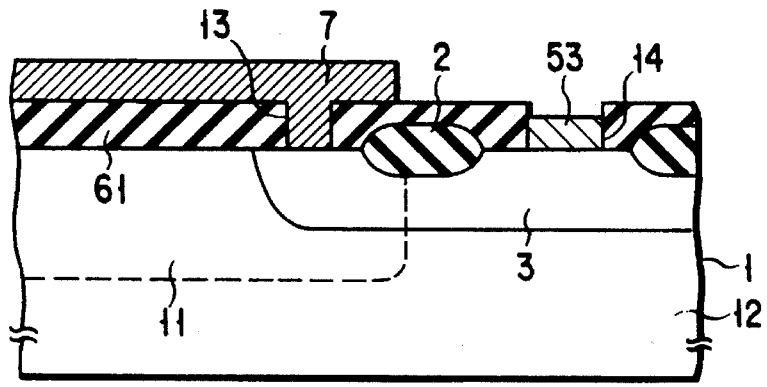
FIG. 7 is a partial cross sectional view showing one of the manufacturing steps of a second embodiment of a semiconductor integrated circuit device according to this invention.
Figure 8:
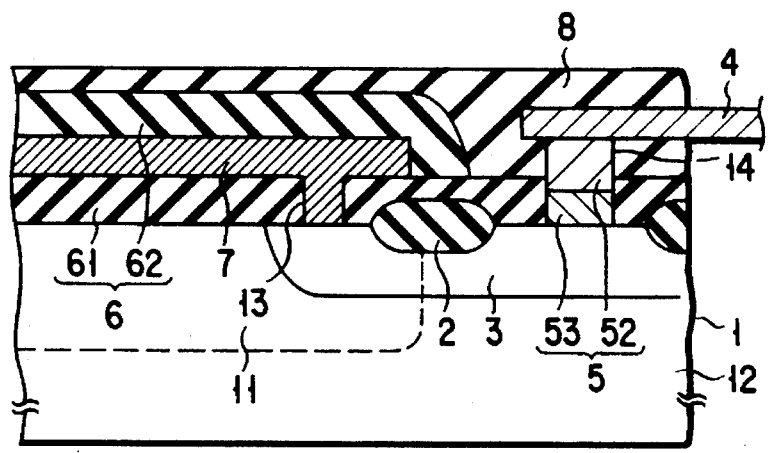
FIG. 8 is a partial cross sectional view showing one manufacturing step for the semiconductor integrated circuit device following the step of FIG. 7.

Next, a second embodiment is explained with reference to FIG. 7, FIG. 8 and FIG. 9. FIG. 7, FIG. 8 and FIG. 9 are partial cross sectional views for illustrating the process for manufacturing the semiconductor integrated circuit device. As shown in FIG. 7, this embodiment is the same as the former embodiment in the process up to the step of forming the contact holes 13, 14 in the inter-level insulating film 61 on the semiconductor substrate 1. In this embodiment, instead of the barrier metal layer 51 used in the former embodiment, an A layer 53 is deposited as the ground metal layer in the contact hole 14 formed in the inactive region 12 in the step of forming the Al wiring 7 on the active region 11 and an Au bump 52 is formed on the Al layer 52 as shown in FIG. 8. An Au-Ge bump may be used instead of the Au bump. Since the lead 4 is formed of Sn-plated Cu, an Au—Sn eutectic is formed between the lead 4 and the bump 52 to fixedly connect them together. After this, as shown in FIG. 9, a passivation film 8 such as a BPSG film which is made flat is formed on the semiconductor substrate 1 including the inactive region 12 and then a sealing substrate 10 formed of a silicon semiconductor substrate is formed on the passivation film by use of epoxy resin bonding agent 9.

For example, an insulating film 18 of $SiO_2$ formed by CVD is formed on the surface of the sealing substrate 10 facing the bonding agent 9. The insulating property of the sealing substrate as the package is obtained by the passivation film and bonding agent and can be further enhanced by coating the surface of the sealing substrate protecting the semiconductor substrate with insulating material. As the insulating material, $Si_3N_4$ can be used instead of $SiO_2$ and the insulating material can be used to form a passivation film.

Next, a third embodiment is explained with reference to FIG. 10 and FIG. 11. FIG. 10 and FIG. 11 are a partial cross sectional view of the semiconductor integrated circuit device and a plan view of the semiconductor substrate. This embodiment has a feature in a sealing means for mounting the sealing substrate 10 on the semiconductor substrate 1 and utilizes a glass sealing body instead of the organic bonding agent 9 used in the former embodiment. As shown in FIG. 10, a semiconductor integrated circuit 39, wiring 7 and inter-level insulating film 61 are formed on the semiconductor substrate 1, a connection electrode 5 which is electrically connected to an impurity diffusion region 3 used as the wiring layer is formed on the inactive region 12, and a lead 4 is mounted on a bump electrode 52 of the electrode 5. A barrier metal layer 51 is formed under the bump electrode 52. After the active region 11 including the wiring 7 is covered with an inter-level insulating film 62, a passivation film 8 such as a BPSG film is formed on the lead 4 and wiring 7. The wiring 7 may be the first-layered wiring on the semiconductor substrate 1 or the topmost wiring layer of the multi-layered wiring. A ring-form glass sealing body 91 formed of low melting glass is formed on that portion of the passivation film 8 which lies above the inactive region 12. Then, the sealing substrate 10 is mounted on the semiconductor substrate 1. For example, a metalized layer 92 of Au or the like is formed on that portion of the sealing substrate 10 which corresponds in position to the glass sealing body 91, the sealing substrate 10 is mounted on the semiconductor substrate 1 with the metalized layer 92 superimposed on the glass sealing body 91 and they are bonded together by thermocompression bonding at temperatures of approx. 200° C. With the above method, the airtightness of the package can be enhanced. Further, it is possible to mount the sealing substrate 10 on the semiconductor substrate 1 without using the metalized layer 92 and attain the air-tightness only by use of the glass sealing body 91.

FIG. 11 shows a glass sealing body 91 is formed in a belt-like ring form above the peripheral portion of the semiconductor substrate 1 lying on the inactive region 12.

Next, a fourth embodiment is explained with reference to FIG. 12 and FIG. 13. FIG. 12 and FIG. 13 are a partial cross sectional view of the semiconductor integrated circuit device and a plan view of the semiconductor substrate. Like the third embodiment, this embodiment has a feature in a means for mounting the sealing substrate 10 on the semiconductor substrate 1. As shown in FIG. 12, a semiconductor integrated circuit 39, wiring 7 and inter-level insulating film 61 are formed on the semiconductor substrate 1, a connection electrode 5 which is electrically connected to an impurity diffusion region 3 used as the wiring layer is formed on the inactive region 12, and a lead 4 is mounted on a bump electrode 52 of the electrode 5. A barrier metal layer 51 is formed under the bump electrode 52. After the active region 11 including the wiring 7 is covered with an inter-level insulating film 62, a passivation film 8 such as a BPSG film is formed on the lead 4 and wiring 7. The wiring 7 may be the first-layered wiring on the semiconductor substrate 1 or the topmost wiring layer of the multi-layered wiring. As shown in FIG. 13, for example, a sealing body 93 formed of Al or the like is formed in a belt-like ring form on the inter-level insulating film 62 by the sputtering method or the like. A similar sealing body 94 of Al or the like is formed on the sealing substrate 10 by the sputtering method, for example. Then, the sealing substrate 10 is mounted on the semiconductor substrate 1 with the sealing bodies 93 and 94 superposed on each other. Then, the sealing substrate 10 is fixedly bonded to the semiconductor substrate 1 by applying ultrasonic vibration to the sealing bodies 93 and 94 to bond the sealing bodies together. With the above method, the airtightness of the package can be enhanced.

It is possible to cover the surface of the sealing substrate 10 of silicon semiconductor facing the substrate 1 with an insulating film such as an $SiO_2$ or $Si_3N_4$ film. Preferably, the position of the sealing body 93 on the semiconductor substrate 1 is set closer to the outermost position thereof, but if it is formed on the lead 4, the lead 4 may break the sealing body at the bonding time or it may be separated from the bonding portion so that it cannot be superposed on the lead 4. Therefore, as shown in the drawing, it is preferable to form the sealing bodies 93, 94 in the boundary portion between the active region 11 and the inactive region 12, for example, above the field oxide film 2 or CVD oxide film 22.

Figure 14:
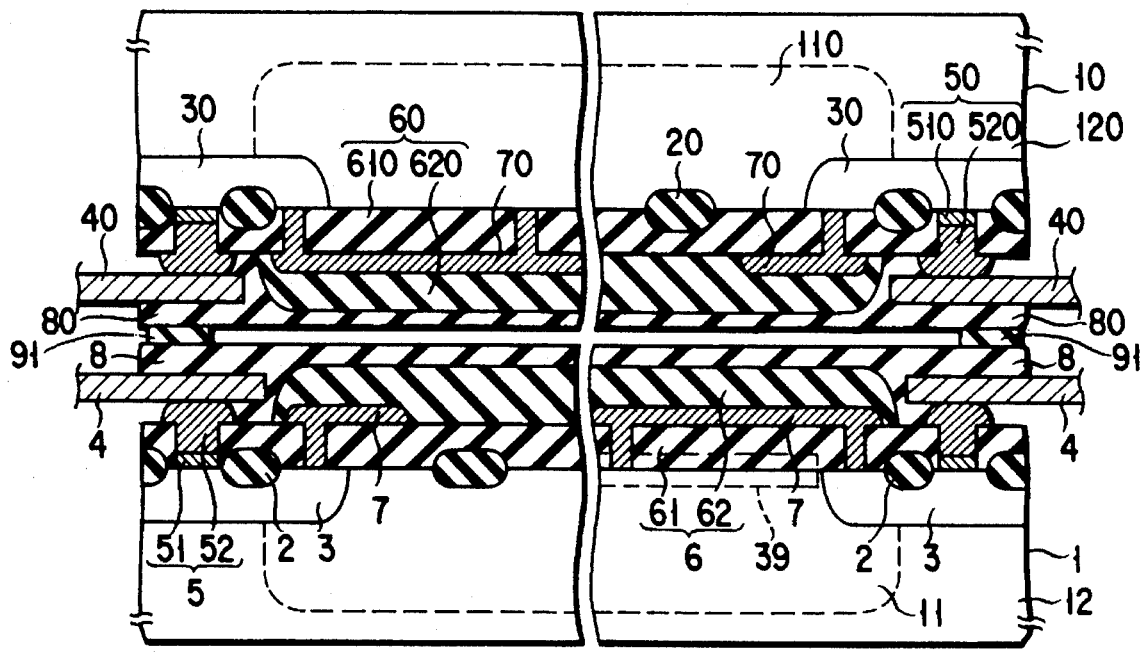
FIG. 14 is a partial cross sectional view showing one of the manufacturing steps of a fifth embodiment of a semiconductor integrated circuit device according to this invention.

Next, a fifth embodiment is explained with reference to FIG. 14. This embodiment has a feature that the semiconductor substrate is used for the sealing substrate, the active region is formed in the semiconductor substrate, and the semiconductor integrated circuit is formed in the active region. The external appearance thereof is similar to that obtained by superposing the conventional semiconductor chips on each other, but it is different in that the external surface of the semiconductor chip, that is, the inactive region of the semiconductor substrate constitutes a package and the external connection leads are connected to the peripheral portion of the semiconductor substrate which is an inactive region. FIG. 14 is a partial cross sectional view of a semiconductor integrated circuit device. As shown in FIG. 14, a semiconductor integrated circuit 39, wiring 7 and inter-level insulating film 61 are formed on the semiconductor substrate 1, a connection electrode 5 which is electrically connected to an impurity diffusion region 3 used as the wiring layer is formed on the inactive region 12, and a lead 4 is mounted on a bump electrode 52 of the electrode 5. A barrier metal layer 51 is formed under the bump electrode 52. After the active region 11 including the wiring 7 is covered with an inter-level insulating film 62, a passivation film 8 such as a BPSG film is formed on the lead 4 and wiring 7. The wiring 7 may be the first-layered wiring on the semiconductor substrate 1 or the topmost wiring layer of the multi-layered wiring.

On the other hand, in the sealing substrate 10, a semiconductor integrated circuit, wiring 70 and inter-level insulating film 610 are formed on the active region 110, a connection electrode 50 which is electrically connected to an impurity diffusion region 30 used as the wiring layer is formed on the inactive region 120, and a lead 40 is mounted on a bump electrode 520 of the connection electrode 50. A barrier metal layer 510 is formed under the bump electrode 520. After the active region 110 including the wiring 70 is covered with an inter-level insulating film 620, a passivation film 80 such as a BPSG film is formed on the lead 40 and wiring 70. The wiring 70 may be the first-layered wiring on the semiconductor substrate 10 or the topmost wiring layer of the multi-layered wiring. The semiconductor substrate 1 and the sealing substrate 10 processed as described above are combined together with a glass sealing body 91 of low melting glass disposed therebetween and bonded together in an airtight fashion by thermocompression bonding at temperatures of approx. 200° C. As the glass material, for example, lead-zinc-boric acid series glass containing Zn of 5 to 20% or Corning 7583 glass is used and processed at sealing temperatures of approx. 380° to 460° C. to complete the semiconductor integrated circuit device. Semiconductor integrated circuits formed on the semiconductor substrate and the sealing substrate may be the same circuits or different circuits. Further, the types of the semiconductor substrates can be made different from each other such that when one semiconductor substrate is used for a logic circuit such as a CPU, the other semiconductor substrate can be used for a memory circuit. In addition, a high power circuit is formed in one substrate and a circuit which generally radiates a small amount of heat is formed in the other substrate.

Figure 15:
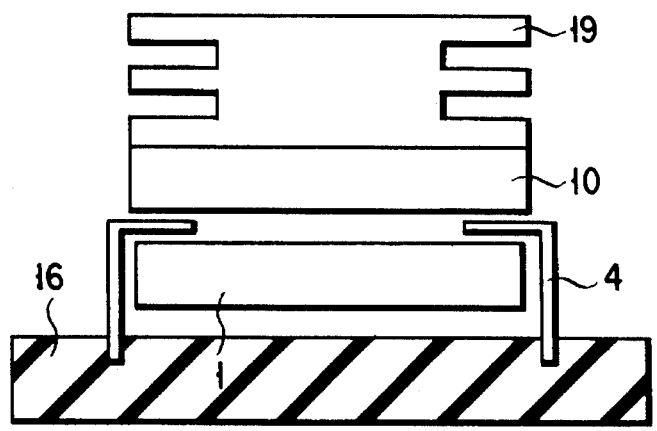
FIG. 15 is a schematic construction view showing a sixth embodiment of a semiconductor integrated circuit device according to this invention.

Next, a sixth embodiment is explained with reference to FIG. 15. This embodiment has a feature in the improvement of the heat radiation property. A lead 4 is mounted on a semiconductor substrate 1 and a sealing substrate 10 is fixedly mounted on the semiconductor substrate 1. Then, a heat radiation fin 19 is mounted on the sealing substrate 10. The heat radiation fin 19 can be easily mounted since the sealing substrate 10 is formed. Further, as a modification of this embodiment, the sealing substrate 10 itself can be used as a heat radiation fin. In this case, as the material of the sealing substrate 10, Cu or the like which is high in the heat radiation property is used. At this time, since it is not necessary to separately provide a fin, the semiconductor integrated circuit device can be prevented from being made thick. Further, it is possible to use a silicon semiconductor substrate having an active region in which an integrated circuit is formed as the sealing substrate 1 and mount the heat radiation fin 19 thereon.

FIGS. 16A to 16D show different mounting means each used for mounting a chip on a circuit board and the shape of a lead to be mounted on the circuit board is explained. The packaged semiconductor integrated circuit device includes a semiconductor substrate and a sealing substrate for protecting the semiconductor substrate, and in this example, it is shown as an integral form as a chip 21. In an example of FIG. 16A, a plurality of leads 4 from the chip 21 are substantially linearly arranged and vertically derived out in one direction. The leads 4 are inserted into mounting holes of the circuit board 16.

Since the chip is held only by use of the leads 4, an insulating sheet 22 of polyimide or the like disposed around the leads between the chip 21 and the circuit board 16 to isolate the chip 21 from the circuit board 16 is used so as to more stably hold the chip 21. In an example of FIG. 16B, the leads 4 are derived in two opposed directions on the chip 21 and the front end portions thereof are bent at right angles. In order to mount the chip on the circuit board, the front end portions of the leads 4 are inserted into the circuit board 16 at right angles like the case of FIG. 16A. The chip 21 is held in parallel to the circuit board 16. FIG. 16C shows an example in which a plurality of substantially linearly arranged leads 4 are derived in the same direction and divided into two portions which are bent at right angles. Since the front end portions of the leads 4 are fixed on the circuit board 16, the chip 21 is not fixedly supported like the case of FIG. 16A and therefore it is necessary to use an insulating sheet or the like for stable support and electrical isolation. In an example of FIG. 16D, the leads 4 which are derived in two directions are bent along the side portions of the chip 21 and the bent portions are mounted on the circuit board 16.

Next, a seventh embodiment is explained with reference to FIG. 17. FIG. 17 shows a state in which a stacked memory to which this invention is applied is mounted on a circuit board 16 by using a sealing substrate, and the stacked memory of this embodiment is obtained as a stacked structure by stacking a plurality of memory units each including a semiconductor substrate 1, a chip 21, a sealing substrate 10 for sealing the chip, and a plurality of leads 4 derived out in two directions by use of bonding agent 9. The bonding agent is not necessarily used. The leads 10 derived out from the respective memory units and superposed on each other are connected together and connected to the circuit board 16 to mount the memory on the circuit board. The memory of the embodiment shown in FIG. 17 is formed with a thickness of approx. 0.6 to 1.8 mm since the thicknesses of the semiconductor substrate 1 and the sealing substrate 10 are 150 to 450 m. Further, if a semiconductor substrate having the sealing substrate 10 on which an integrated circuit is formed is used, the thickness of the semiconductor integrated circuit device can be reduced to a value which is not larger than one half the thickness of the conventional semiconductor integrated circuit device while the capacity thereof is kept at the same value as that of the conventional semiconductor integrated circuit device.

Figure 18:
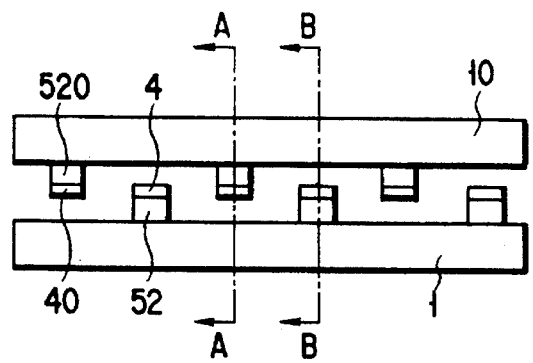
FIG. 18 is a front view showing the arrangement of leads and showing an eighth embodiment of a semiconductor integrated circuit device according to this invention and using a semiconductor substrate having an integrated circuit formed as a sealing substrate.
Figure 19:
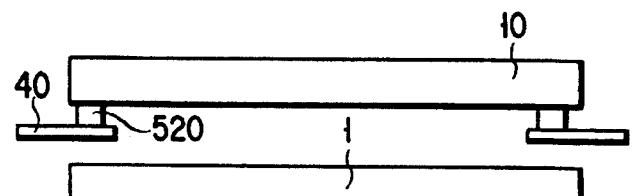
FIG. 19 is a cross sectional view taken along the A—A line of FIG. 18.
Figure 20:
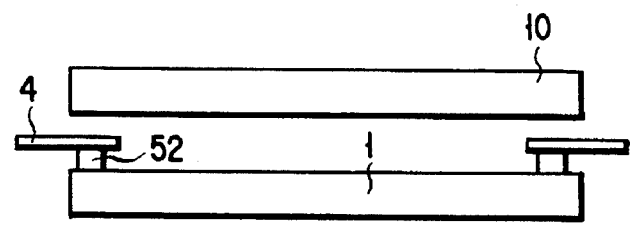
FIG. 20 is a cross sectional view taken along the B—B line of FIG. 18.
Figure 21:
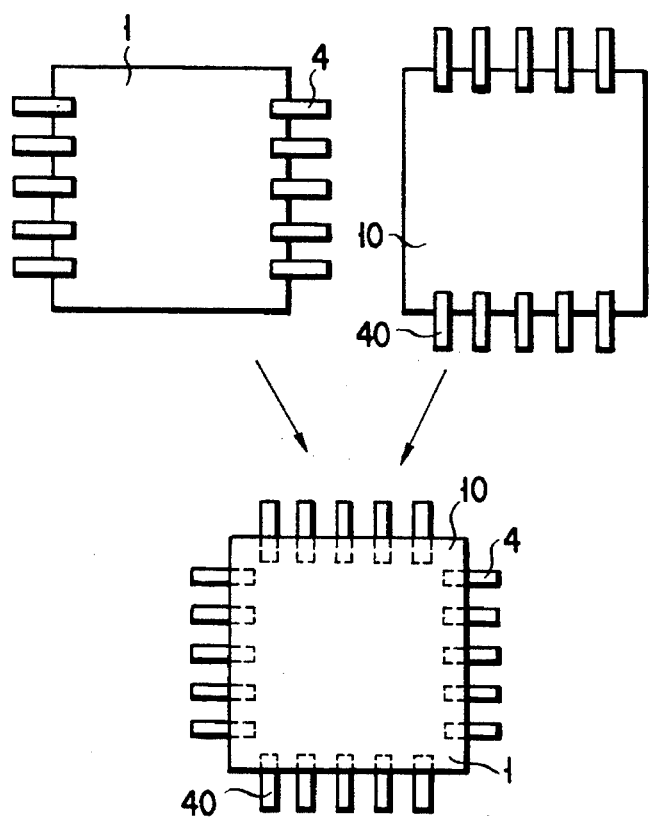
FIG. 21 is a view showing the positional relation between the lead of the semiconductor substrate on which the semiconductor integrated circuit device is formed and the lead of the sealing substrate.

Next, an eighth embodiment is explained with reference to FIG. 18. In this embodiment, a semiconductor substrate having a sealing substrate 10 on which a stacked memory to which this invention is applied is mounted on a circuit board 16 by using a sealing substrate, and the stacked memory of this embodiment is obtained as a stacked structure by stacking a plurality of memory units each including a semiconductor substrate 1, a chip 21, a sealing substrate 10 for sealing the chip, and a plurality of leads 4 derived out in two directions by use of bonding agent 9. The bonding agent is not necessarily used. The leads derived out from the respective memory units and superposed on each other are connected together and connected to the circuit board 16 to mount the memory on the circuit board. The memory of the embodiment shown in FIG. 17 is formed with a thickness of approx. 0.6 to 1.8 mm since the thicknesses of the semiconductor substrate 1 and the sealing substrate 10 are 150 to 450 μm. Further, if a semiconductor substrate having the sealing substrate 10 on which an integrated circuit is formed is used, the thickness of the semiconductor integrated circuit device can be reduced to a value which is not larger than one half the thickness of the conventional semiconductor integrated circuit device while the capacity thereof is kept at the same value as that of the conventional semiconductor integrated circuit device.

Next, an eighth embodiment is explained with reference to FIG. 18. In this embodiment, a semiconductor substrate having a sealing substrate 10 on which substrate, two sheets of semiconductor substrates having active regions are used. In the lower semiconductor substrate 1, the leads 4 are derived out from the right and left sides thereof, and in the upper semiconductor substrate 10, the leads 40 are derived out from the upper and lower sides thereof.

Figure 22:
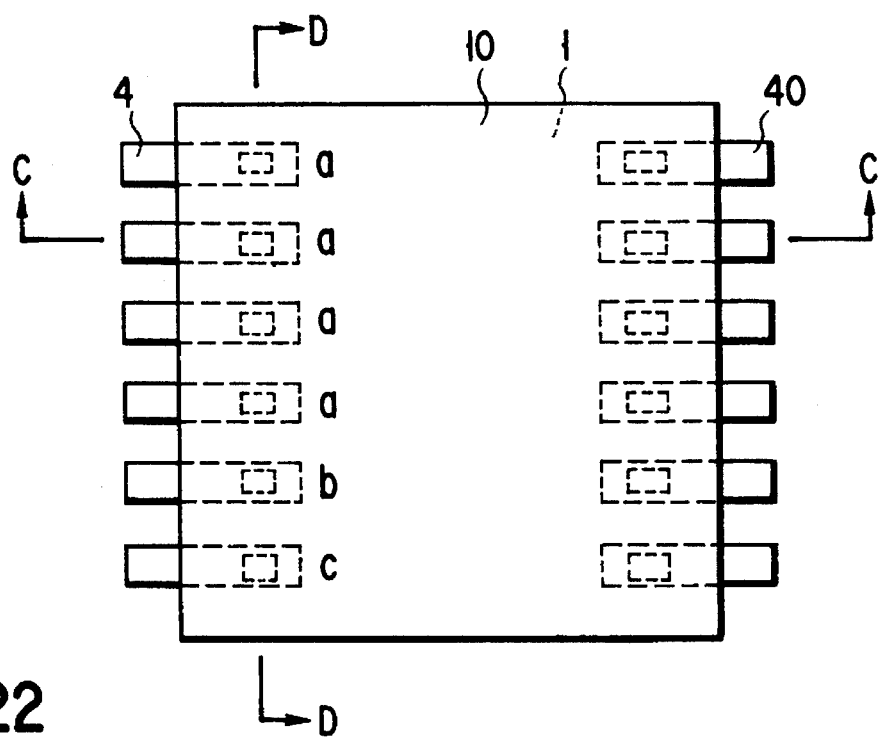
FIG. 22 is a plan view showing the arrangement of derived-out leads and showing a ninth embodiment of a semiconductor integrated circuit device according to 10 this invention and using a semiconductor substrate having an integrated circuit formed as a sealing substrate.
Figure 23:
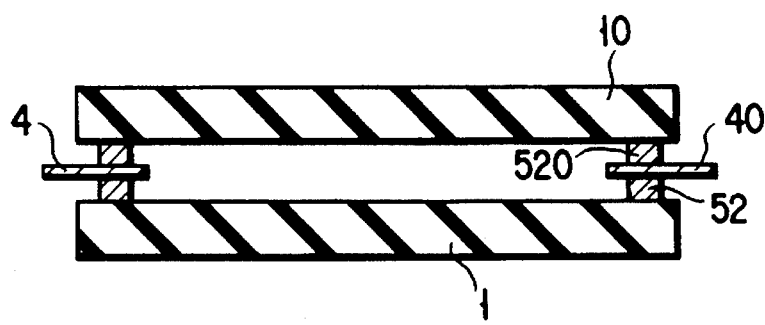
FIG. 23 is a cross sectional view taken along the C—C line of FIG. 22.
Figure 24:
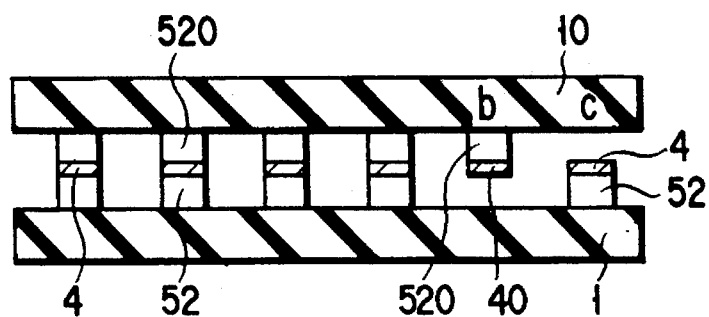
FIG. 24 is a cross sectional view taken along the D—D line of FIG. 22.

Next, an embodiment in which a semiconductor substrate having a sealing substrate 10 in which an active region is formed is explained with reference to FIG. 22. FIG. 22 is a plan view showing a state in which the semiconductor substrate 1 and the sealing substrate 10 are combined together with leads 4, 40 disposed therebetween, FIG. 23 is a cross sectional view taken along the C—C line of FIG. 22, and FIG. 24 is a cross sectional view taken along the D—D line of FIG. 22. For example, in a case where data lines or the like are used for the leads as shown in FIG. 23, the leads can be connected to both of the bumps 52, 520 of the semiconductor substrates 1, 10 like leads a. However, the semiconductor substrate selection terminal cannot be commonly used for both of the semiconductor substrates, and as shown in FIG. 24, the lead 40 is connected to the bump 520 of the upper semiconductor substrate 10 like a lead b and the lead 4 is connected to the bump 52 of the lower semiconductor substrate 1 like a lead c. This structure can be most suitably used for the memory shown in FIG. 17.

Next, an embodiment in which a polysilicon layer formed on the semiconductor substrate is used as connection means for electrically connecting a connection electrode formed on the inactive region of the semiconductor substrate to a semiconductor integrated circuit formed in the active region is explained with reference to FIG. 25. FIG. 25 is a partial cross sectional view showing a semiconductor substrate 1 of a semiconductor integrated circuit device. A polysilicon layer 23 is formed on the active region 11 and a field oxide film 2 lying on the boundary portion between the active region 11 and the inactive region 12. The polysilicon layer 23 is formed also on that portion of the inactive region 12 which corresponds in position to the electrode pad 52. The polysilicon layer 23 is formed in contact with a high impurity concentration diffusion region 24 which is connected with an integrated circuit in the active region 11 and the lead 4 for connection with the external circuit is connected to the polysilicon layer 23 on the barrier metal layer 53. As is indicated in an embodiment shown in FIG. 26, it is possible to use an AZ wiring 7 lying on the active region 11 and connected to the semiconductor integrated circuit without using an $N^+$-type high impurity concentration diffusion region 24 formed in the semiconductor substrate 1. Further, as a lead connected to the connection electrode formed in the inactive region of the semiconductor substrate, conductive leads regularly formed on a tape-form film which is a so-called TAB (Tape Automated Bonding) tape can be used.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit device comprising:

a first semiconductor integrated circuit device which comprises a first semiconductor substrate including an active region arranged in a main surface area and an inactive region arranged in a peripheral portion of the main surface area; a first semiconductor integrated circuit formed in the active region in the main surface area of said first semiconductor substrate; a first connection electrode formed in the inactive region; lead means having one end connected to said first connection electrode and the other end arranged to extend to the exterior of said first semiconductor substrate;

connection means for electrically connecting said first semiconductor integrated circuit to said first connection electrode; and sealing means for sealing said first semiconductor integrated circuit device by using the inactive region of said semiconductor substrate of said first semiconductor integrated circuit device as a package region, said sealing means including a second semiconductor integrated circuit device which comprises a second semiconductor substrate which has a main surface facing the main surface of said first semiconductor substrate of said first semiconductor integrated circuit device and has an active region formed in the main surface and an inactive region formed in the peripheral portion of the main surface, a second connection electrode formed in said inactive region, and lead means having one end connected to said second connection electrode and the other end arranged to extend to the exterior of said second semiconductor substrate; and connection means for connecting said first and second semiconductor integrated circuit devices together in an air-tight fashion.

2. A semiconductor integrated circuit device according to claim 1, wherein said connection means is a glass sealing body.

3. A semiconductor integrated circuit device according to claim 1, wherein said connection means is a ring-form metal sealing body.

4. A semiconductor integrated circuit device comprising:

a first semiconductor substrate having an active region arranged in a main surface area and an inactive region arranged in a peripheral portion of the main surface area;

a first semiconductor integrated circuit formed in the active region in the main surface area of said semiconductor substrate;

a first connection electrode formed in the inactive region;

lead means having one end connected to a metal wiring formed on an insulating film above the first semiconductor substrate via said first connection electrode and an impurity diffusion region and the other end arranged to extend to the exterior of said first semiconductor substrate;

connection means for electrically connecting said first semiconductor integrated circuit to said first connection electrode; and sealing means having a sealing substrate formed by a passivation film made of a BPSG (boron, phosphide, silica and glass) and a sealing board made of a silicon semiconductor substrate and for covering at least the active region of said semiconductor substrate, said connection electrode, part of said lead means arranged on the main surface of said semiconductor substrate, and said connection means, wherein said connection means is an impurity diffusion region formed over the boundary between said active and said inactive region of said semiconductor substrate.

5. A semiconductor integrated circuit device comprising:

a first semiconductor substrate having an active region arranged in a main surface area and an inactive region arranged in a peripheral portion of the main surface area;

a first semiconductor integrated circuit formed in the active region in the main surface area of said semiconductor substrate;

a first connection electrode formed in the inactive region;

lead means having one end connected to a metal wiring formed on an insulating film above the first semiconductor substrate via said first connection electrode and an impurity diffusion region and the other end arranged to extend to the exterior of said first semiconductor substrate;

connection means for electrically connecting said first semiconductor integrated circuit to said first connection electrode; and sealing means having a sealing substrate formed by a passivation film made of a BPSG (boron, phosphide, silica and glass) and a sealing board made of a silicon semiconductor substrate and for covering at least the active region of said semiconductor substrate, said connection electrode, part of said lead means arranged on the main surface of said semiconductor substrate, and said connection means, wherein said connection means is a polysilicon film formed on said semiconductor substrate.

* * * * *